US00RE46799E

(19) United States
(12) Reissued Patent
Saito et al.

(10) Patent Number: US RE46,799 E
(45) Date of Reissued Patent: Apr. 17, 2018

(54) SEMICONDUCTOR DEVICE WITH ALTERNATING CONDUCTIVITY TYPE LAYERS HAVING DIFFERENT VERTICAL IMPURITY CONCENTRATION PROFILES

(71) Applicant: KABUSHIKI KAISHA TOSHIBA, Tokyo (JP)

(72) Inventors: Wataru Saito, Kawasaki (JP); Ichiro Omura, Yokohama (JP); Kozo Kinoshita, Kawasaki (JP)

(73) Assignee: KABUSHIKI KAISHA TOSHIBA, Tokyo (JP)

(21) Appl. No.: 15/252,058

(22) Filed: Aug. 30, 2016

Related U.S. Patent Documents

Reissue of:
(64) Patent No.: 6,888,195
Issued: May 3, 2005
Appl. No.: 10/342,364
Filed: Jan. 15, 2003

(30) Foreign Application Priority Data

Sep. 25, 2002 (JP) ..... 2002-279463

(51) Int. Cl.
*H01L 29/66* (2006.01)
*H01L 29/78* (2006.01)
(Continued)

(52) U.S. Cl.
CPC ..... *H01L 29/0634* (2013.01); *H01L 29/7813* (2013.01); *H01L 29/0653* (2013.01); *H01L 29/0696* (2013.01)

(58) Field of Classification Search
CPC ..... H01L 29/66712; H01L 29/66734; H01L 29/7811; H01L 29/7813; H01L 29/872;
(Continued)

(56) References Cited

U.S. PATENT DOCUMENTS 5,466,303 A * 11/1995 Yamaguchi ..... H01L 21/02046 148/33
5,844,275 A * 12/1998 Kitamura ..... H01L 29/0653 257/335
(Continued)

FOREIGN PATENT DOCUMENTS

DE 19840032 C1 11/1999
JP 2000-286417 10/2000
(Continued)

OTHER PUBLICATIONS

R. Ng et al., "Lateral Unbalanced Super Junction (USJ)/3D—Resurf for High Breakdown Voltage on SOI", Proceedings of 2001 International Symposium on Power Semiconductor Devices & ICs, Osaka, pp. 395-398.
(Continued)

*Primary Examiner* — Deandra Hughes
(74) *Attorney, Agent, or Firm* — Patterson & Sheridan, LLP

(57) ABSTRACT

A power semiconductor device is disclosed, which comprises a semiconductor layer including a first semiconductor layer of a first conductivity type and a second semiconductor layer of a second conductivity type, which are periodically formed in the lateral direction, and a power semiconductor element including the semiconductor layers that are formed periodically, wherein a distribution of an amount of an impurity in a vertical direction of the first semiconductor layer differs from a distribution of an amount of an impurity in the vertical direction of the second semiconductor layer.

34 Claims, 7 Drawing Sheets

(51) Int. Cl.
*H01L 29/06* (2006.01)
*H01L 29/02* (2006.01)

(58) Field of Classification Search
CPC . H01L 29/0634; H01L 29/7397; H01L 29/74; H01L 29/404; H01L 29/4238; H01L 29/045; H01L 29/0615; H01L 29/0619; H01L 29/0649; H01L 29/0696; H01L 29/0878; H01L 29/1095
See application file for complete search history.

(56) References Cited

U.S. PATENT DOCUMENTS 6,040,600 A * 3/2000 Uenishi ..... H01L 21/26546 257/330
6,291,856 B1 9/2001 Miyasaka et al. .. H01L 29/0634 257/335
6,297,534 B1 * 10/2001 Kawaguchi ..... H01L 29/0634 257/341
6,313,482 B1 11/2001 Baliga
6,404,010 B2 * 6/2002 Saggio et al. ..... 257/341
6,475,864 B1 * 11/2002 Sato et al. ..... H01L 29/0634 257/E21.418
6,509,608 B1 * 1/2003 Hueting ..... H01L 29/7813 257/330
6,512,268 B1 * 1/2003 Ueno ..... H01L 29/0634 257/341
6,551,909 B1 * 4/2003 Fujihira ..... 438/510
6,586,801 B2 * 7/2003 Onishi ..... H01L 29/0634 257/339
6,608,350 B2 * 8/2003 Kinzer ..... H01L 29/0634 257/331
6,611,021 B1 * 8/2003 Onishi et al. ..... H01L 29/0634 257/213
6,627,949 B2 * 9/2003 Blanchard ..... 257/328
6,630,698 B1 10/2003 Deboy et al.
6,667,515 B2 * 12/2003 Inoue ..... H01L 29/0619 257/339
6,677,626 B1 * 1/2004 Shindou ..... H01L 29/0619 257/266
6,683,347 B1 * 1/2004 Fujihira ..... 257/341
6,689,662 B2 * 2/2004 Blanchard ..... H01L 22/26 257/E21.149
6,693,338 B2 * 2/2004 Saitoh ..... H01L 21/3247 257/492
6,700,141 B2 * 3/2004 Iwamoto ..... H01L 29/7802 257/110
6,730,962 B2 * 5/2004 Wu ..... H01L 21/76202 257/336
6,750,508 B2 * 6/2004 Omura ..... H01L 29/8725 257/329
6,750,524 B2 * 6/2004 Parthasarthy ..... H01L 29/0634 257/328
6,821,824 B2 * 11/2004 Minato ..... H01L 29/0619 257/110
6,849,900 B2 2/2005 Aida et al.
6,878,989 B2 * 4/2005 Izumisawa ..... H01L 29/0634 257/328
6,949,798 B2 * 9/2005 Nitta ..... H01L 29/0634 257/339
6,995,426 B2 * 2/2006 Okumura ..... H01L 29/0634 257/341
7,091,579 B2 * 8/2006 Nemoto ..... H01L 21/263 257/655

FOREIGN PATENT DOCUMENTS

JP 2000286417 A 10/2000
JP 2001-244472 9/2001
JP 2001244472 A 9/2001
JP 2001-313391 11/2001
JP 2001313391 A 11/2001
JP 2004-72068 3/2004
JP 2004072068 A 3/2004
WO 0014807 A1 3/2000

OTHER PUBLICATIONS

R. Ng, et al. "Lateral Unbalanced Super Junction (USJ)/3D—Resurf for High Breakdown Voltage on SOI", Proceedings of 2001 International Symposium on Power Semiconductor Devices & ICs, pp. 395-398, 2001.

* cited by examiner

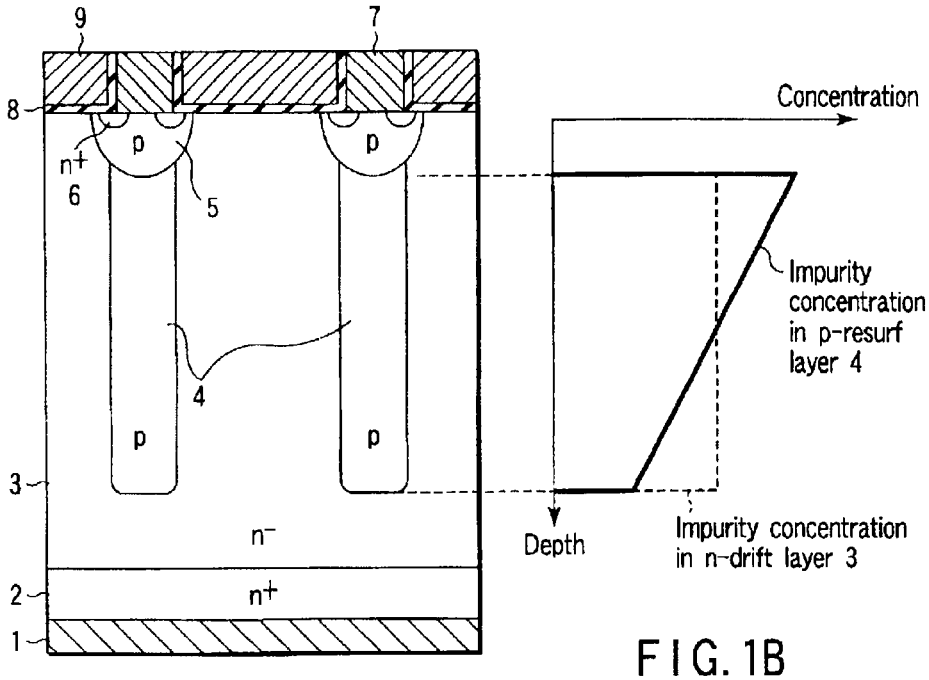
FIG. 1A
FIG. 1B
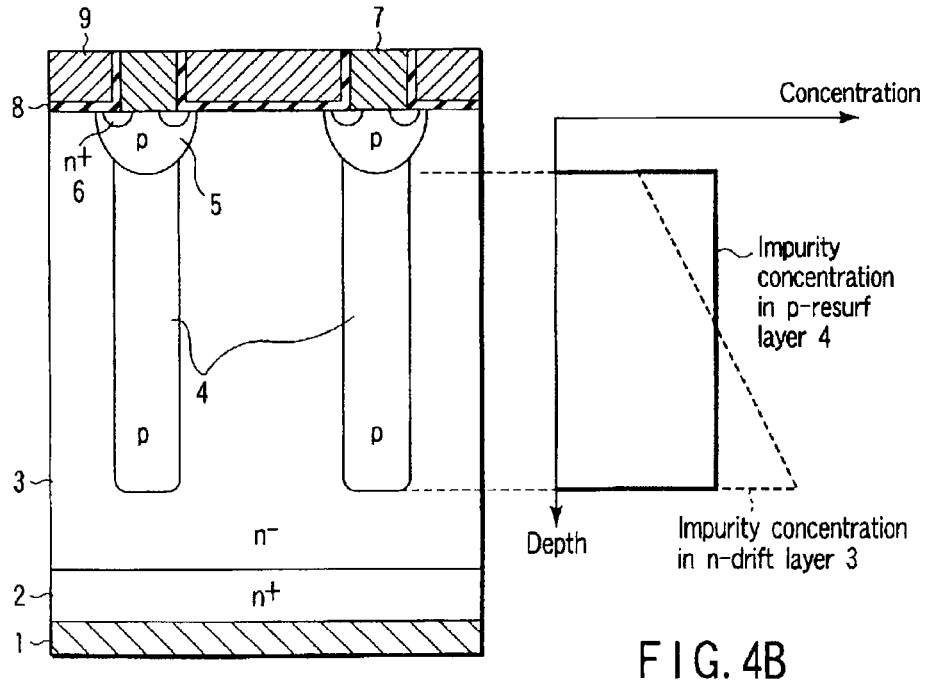
FIG. 4A
FIG. 4B

SEMICONDUCTOR DEVICE WITH ALTERNATING CONDUCTIVITY TYPE LAYERS HAVING DIFFERENT VERTICAL IMPURITY CONCENTRATION PROFILES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2002-279463, filed Sep. 25, 2002, the entire contents of which are incorporated herein by reference.

BACKGROUND OF THE INVENTION

1. Field of the Invention

The present invention relates to a power semiconductor device used for controlling a large power, particularly, to an element having a super junction structure and used in, for example, a vertical power MOSFET, SBD, MPS diode, SIT, JFET or IGBT.

2. Description of the Related Art

In a vertical power MOSFET, which is one of power semiconductor elements, the on-resistance is greatly dependent on the electrical resistance of the conductive layer (drift layer) portion. The dopant concentration determining the electrical resistance of the drift layer cannot be increased to exceed a limit in accordance with the breakdown voltage of the pn junction formed between the base layer and the drift layer. Therefore, there is a trade-off relationship between the breakdown voltage of the element and the on-resistance. It is important to the low consumption power element to improve the trade-off relationship. The trade-off has a limit determined by the material of the element. In order to achieve a low on-resistance element exceeding the existing power element, it is necessary to exceed the limit noted above.

Known as an example of the MOSFET effective for overcoming the problem noted above is an MOSFET in which a resurf structure, which is called a super junction structure, is buried in the drift layer.

FIG. 13A is a cross sectional view schematically showing the construction of a vertical power MOSFET having a resurf structure buried therein. In the MOSFET shown in the drawing, an $n^+$-type drain layer 2 is formed on one surface of an n-type drift layer 3, and a drain electrode 1 is formed on the $n^+$-type drain layer 2. Also, a plurality of p-type base layers 5 are selectively formed on the other surface of the n-type drift layer 3, and an $n^+$-type source layer 6 is selectively formed on the surface of each of the p-type base layers 5.

A gate insulating film 8 is formed to cover the surfaces of the $n^+$-type source layer 6, the p-type base layer 5, the n-type drift layer 3, the adjacent p-type base layer 5 and the $n^+$-type source layer 6 formed within the p-type base layer 5, and a gate electrode 9 is formed on the gate insulating film 8. Also, a source electrode 7 is formed on the p-type base layer 5 in a manner to surround the gate electrode 9 with the gate insulating film 8 interposed therebetween. The source electrode 7 thus formed is connected to the surfaces of the $n^+$-type source layer 6 and the p-type base layer 5.

A p-type resurf layer 4 connected to the p-type base layer 5 is formed within the n-type drift layer 3 positioned between the p-type base layer 5 and the drain electrode 1. In this case, formed is a vertical resurf structure in which the p-type resurf layer 4 and the n-type drift layer 3 are alternately repeated in the lateral direction. It is possible to increase the impurity concentration in the n-type drift layer 3 by narrowing the clearance of the resurf (cell width) so as to lower the on-resistance.

FIG. 13B shows the impurity concentration profile in the vertical direction in the n-type drift layer 3 and the p-type resurf layer 4 in the vertical power MOSFET shown in FIG. 13A. The n-type drift layer 3 and the p-type resurf layer 4 are equal to each other in the impurity concentration and has a prescribed impurity concentration profile in the vertical direction.

What is important in manufacturing the MOSFET of the construction described above is how to design the super junction structure. To be more specific, the impurity concentration in the n-type drift layer 3 and the p-type resurf layer 4 constitutes an important factor for determining the breakdown voltage and the on-resistance.

In principle, the impurity concentration can be made equivalently zero by making the impurity concentration in the n-type drift layer 3 equal to that in the p-type resurf layer 4 so as to obtain a high breakdown voltage. Therefore, it is possible to make the impurity concentration in the n-type drift layer 3 higher than the impurity concentration in the drift layer in the conventional MOSFET while retaining the breakdown voltage so as to realize a low on-resistance exceeding the limit of the material.

However, in manufacturing the MOSFET, it is difficult to make the amount of the impurity in the n-type drift layer 3 perfectly equal to that in the p-type resurf layer 4 because of the nonuniformity in the process so as to deteriorate the breakdown voltage.

Such being the situation, it is necessary to design the element in view of the deterioration of the breakdown voltage caused by the nonuniformity in the manufacturing process. In this case, for lowering the on-resistance, it is effective to increase the impurity concentration in the n-type drift layer 3. It should be noted in this connection that the process margin relative to the breakdown voltage is determined by the unbalance amount, i.e., the difference in the amount of the impurity between the n-type drift layer 3 and the p-type resurf layer 4. In other words, even if the impurity concentration in the n-type drift layer 3 is increased, the unbalance amount that can be taken as a process margin remains unchanged.

It follows that, if the impurity concentration in the n-type drift layer 3 is increased, the ratio of the allowable unbalance amount to the amount of the impurity in the n-type drift layer 3 is diminished so as to diminish the process margin. On the other hand, in order to ensure a wide process margin, it is necessary to lower the impurity concentration in the n-type drift layer 3, with the result that the on-resistance is increased.

Incidentally, Japanese Patent Disclosure (Kokai) No. 2001-244472 shows in FIG. 1 a semiconductor device that permits increasing the allowable on-current and suppressing the output capacity and the on-resistance while satisfying the required breakdown voltage. In the semiconductor device disclosed in this prior art, an $n^{++}$-type drain region and a $p^+$-type well region are formed apart from each other in an n-type semiconductor layer of an SOI structure. Also, an $n^{++}$-type source region is formed within the $p^{+}$-type well region, and an n-type drift region is formed between the $n^{++}$-type drain region and the $p^{+}$-type well region. Further, the impurity concentration within the n-type drift region is distributed such that the impurity concentration is lowered away from the $n^{++}$-type drain region in each of the lateral direction and the vertical direction of the n-type semiconductor layer.

Japanese Patent Disclosure No. 2001-313391 discloses in FIG. 1 a super junction semiconductor device that permits suppressing the injection of hot carriers into an insulating film and that does not impair the characteristics and reliability of the element active region. The super junction semiconductor device disclosed in this prior art comprises a drain-drift section of a parallel pn junction structure. In this prior art, a p-type breakdown voltage limiter region having a high impurity concentration is formed in that portion of the p-type partition region which forms the well bottom surface of the p-type base region.

U.S. Pat. No. 6,291,856 shows in FIGS. 3 and 4 an MOSFET of a super junction structure, in which the amount of an impurity in the drift layer is defined.

Further, Japanese Patent Disclosure No. 2000-286417 shows in FIG. 1 a lateral MOSFET of a multi-resurf structure. It is taught that a low on-resistance and a high breakdown voltage can be achieved simultaneously in this prior art.

Still further, a power semiconductor element of a super junction structure having a high breakdown voltage and a low on-resistance is disclosed in "Lateral Unbalanced Super junction (USJ/3D-RESURF for High Breakdown Voltage on SOI" by R. Ng, et al, Proceedings of 2001 International Symposium on Power Semiconductor Devices & ICs, Osaka, pp. 395-398. It is taught that the power semiconductor layer of a super junction structure can be achieved by employing a lateral structure in the semiconductor layer of an SOI structure.

As described above, in the conventional vertical power MOSFET, the reduction of the on-resistance is contradictory to the requirement for the expansion of the process margin in respect of the amount of the impurity relative to the breakdown voltage. The difficulty is coped with by setting the impurity concentration in the n-type drift layer 3 at an appropriate value in designing the semiconductor device.

BRIEF SUMMARY OF THE INVENTION

According to an aspect of the present invention, there is provided power semiconductor device comprising a semiconductor layer including a first semiconductor layer of a first conductivity type and a second semiconductor layer of a second conductivity type, which are periodically formed in the lateral direction; and a power semiconductor element including the semiconductor layers that are formed periodically, wherein a distribution of an amount of an impurity in a vertical direction of the first semiconductor layer differs from a distribution of an amount of an impurity in the vertical direction of the second semiconductor layer.

According to another aspect of the present invention, there is provided a power semiconductor device comprising a first semiconductor layer of a first conductivity type; a first main electrode electrically connected to the first semiconductor layer; second semiconductor layers of a second conductivity type formed within the first semiconductor layer and periodically arranged in a lateral direction, a distribution of an amount of an impurity in a vertical direction of the second semiconductor layers being differ from a distribution of an amount of the impurity in the vertical direction of the first semiconductor layer; a third semiconductor layer of the second conductivity type selectively formed in surfaces of the first semiconductor layer and the second semiconductor layer; a fourth semiconductor layer of the first conductivity type selectively formed in a surface of the third semiconductor layer; a second main electrode formed to be connected to the surface of the third semiconductor layer and a surface of the fourth semiconductor layer; and a control electrode formed on the first semiconductor layer, the third semiconductor layer and the fourth semiconductor layer with a gate insulating film interposed therebetween.

BRIEF DESCRIPTION OF THE SEVERAL VIEWS OF THE DRAWING

FIG. 1A is a cross sectional view schematically showing the construction of a vertical power MOSFET according to a first embodiment of the present invention;

FIG. 1B shows the impurity concentration profile in the vertical direction in the n-type drift layer and the p-type resurf layer included in the MOSFET shown in FIG. 1A;

FIG. 4A is a cross sectional view schematically showing the construction of a modification of the MOSFET shown in FIG. 1A;

FIG. 4B shows the impurity concentration profile in the vertical direction in the n-type drift layer and the p-type resurf layer included in the MOSFET shown in FIG. 4A;

DETAILED DESCRIPTION OF THE INVENTION

Figure 2:
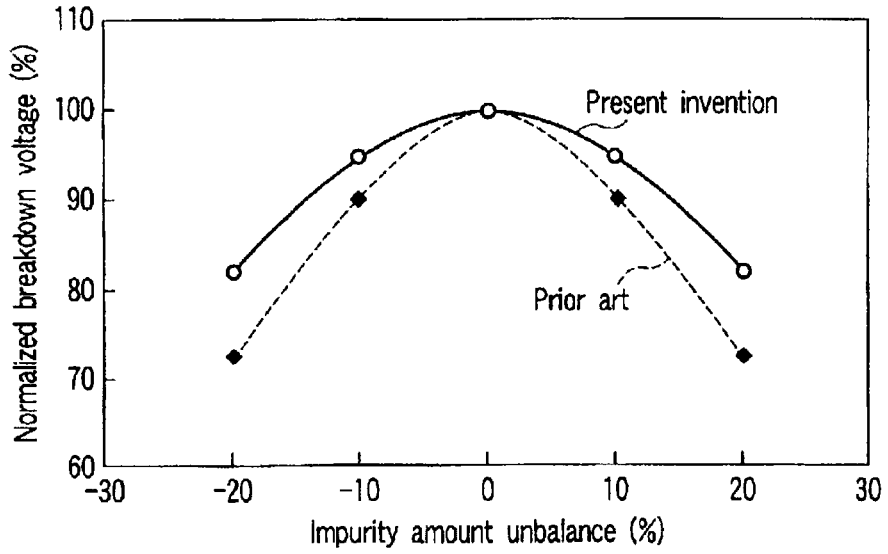
FIG. 2 is a graph showing the relationship between the normalized breakdown voltage and the unbalance amount, i.e., the difference in the amount of the impurity between the n-type drift layer and the p-type resurf layer in the MOSFET shown in FIG. 1A.

Embodiments of the present invention will now be described with reference to the accompanying drawings. In the embodiments described in the following, the first conductivity type is n-type and the second conductivity type is p-type. Also, the same parts or portions of the semiconductor device are denoted by the same reference numerals throughout the drawings.

<First Embodiment>

FIG. 1A is a cross sectional view schematically showing the construction of a vertical power MOSFET having a resurf structure buried therein according to a first embodiment of the present invention.

In the MOSFET shown in FIG. 1A, a high impurity semiconductor layer, e.g., an $n^+$-type drain layer, 2 is formed on one surface of an n-type drift layer 3, which is a first semiconductor layer, and a drain electrode 1, which is a main electrode, is formed on the $n^+$-type drain layer 2.

A plurality of p-type resurf layers 4 are periodically arranged in the lateral direction as second semiconductor layers in the other surface of the n-type drift layer 3 to form a super junction structure.

A p-type base layer 5 is formed as a third semiconductor layer in the surface of the super junction structure, and an $n^+$-type source layer 6 is selectively formed by diffusion as a fourth semiconductor layer in the surface of the p-type base layer 5 in the shape of a planar stripe.

The p-type base layer 5 has an impurity concentration of, for example, about $1\times10^{17}$ $cm^{-3}$ and is formed in a depth of about 2.0 μm. Also, the $n^+$-type source layer 7 has an impurity concentration of, for example, $1\times10^{20}$ $cm^{-3}$ and is formed in a depth of about 0.2 μm.

A gate insulating film, e.g., a silicon oxide film, 8 is formed in a thickness of about 0.1 μm in a manner to cover the surface of the region including the $n^+$-type source layer 6, the p-type base layer 5, the n-type drift layer 3, the adjacent p-type base layer 5 and the $n^+$-type source layer 6 positioned inside the p-type base layer 5, and a gate electrode 9 is formed as a first control electrode on the gate insulating film 8 in the shape of a planar stripe.

Further, a source electrode 7 is formed as a second main electrode in the shape of a planar stripe on the surface of each of the p-type base layers 5 in a manner to surround the gate electrode 9 with the gate insulating film 8 interposed therebetween. The source electrode 7 thus formed is connected to the surfaces of each of the $n^+$-type source layer 6 and the p-type base layer 5.

In other words, a plurality of p-type base layers 5 are selectively formed on the other surface of the n-type drift layer 3, and the $n^+$-type source layer 6 is selectively formed on the surface of each of the p-type base layers 5. Also, a p-type resurf layer 4 connected to the p-type base layer 5 is formed within the n-type drift layer 3 positioned between the p-type base layer 5 and the drain electrode 1. In this case, formed is a vertical resurf structure in which the p-type resurf layer 4 and the n-type drift layer 3 are alternately repeated in the lateral direction. It is possible to increase the impurity concentration in the n-type drift layer 3 by narrowing the clearance of the resurf (cell width) so as to lower the on-resistance.

In view of the principle of the super junction structure, it is desirable for the sum of the impurity in the n-type drift layer 3 to be equal to the sum of the impurity in the p-type resurf layer 4. If the sum of the impurity in the n-type drift layer 3 is equal to the sum of the impurity in the p-type resurf layer 4, the equivalent impurity amount in the drift layer is increased so as to lower the breakdown voltage.

FIG. 1B shows the distribution profile in the vertical direction of the impurity concentration in each of the n-type drift layer 3 and the p-type resurf layer 4 shown in FIG. 1A. As shown in FIG. 1B, the impurity concentration in the n-type drift layer 3 has a uniform profile. On the other hand, the impurity concentration in the p-type resurf layer 4 is gradually decreased in the vertical direction (depth direction) from the source electrode 7 toward the drain electrode 1 so as to form an inclined distribution profile.

Figure 13A:
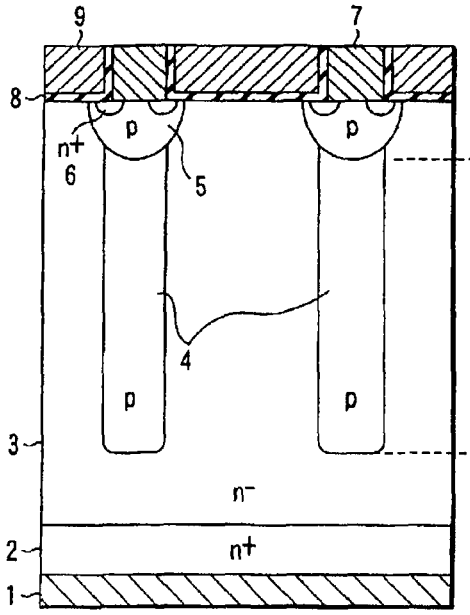
FIG. 13A PRIOR ART
FIG. 13A is a cross sectional view schematically showing the construction of a conventional vertical power MOSFET having a resurf structure buried therein.
Figure 13B:
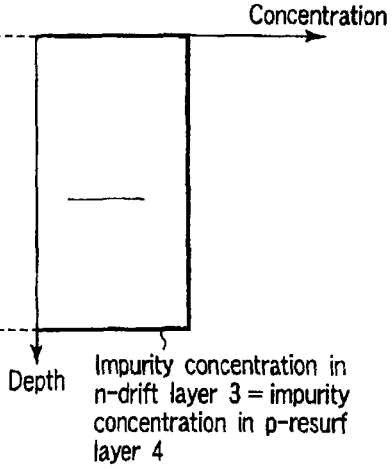
FIG. 13B PRIOR ART
FIG. 13B shows the impurity concentration profile in the vertical direction in the n-type drift layer and the p-type resurf layer included in the conventional power MOSFET having a resurf structure buried therein as shown in FIG. 13A.

FIG. 2 is a graph showing the change in the normalized breakdown voltage relative to the unbalance amount, i.e., the difference in the amount of the impurity between the n-type drift layer 3 and the p-type resurf layer 4 included in the MOSFET according to the first embodiment of the present invention, which is shown in FIG. 1A. FIG. 2 also shows for comparison the change in the normalized breakdown voltage in respect of the conventional MOSFET having a super junction structure, which is shown in FIG. 13A. As apparent from FIG. 2, the MOSFET according to the first embodiment of the present invention is smaller in the reduction of the normalized breakdown voltage relative to the unbalance amount of the impurity than the conventional MOSFET.

To be more specific, in view of the principle of the super junction structure, if the impurity concentration in the n-type drift layer 3 is increased for lowering the on-resistance, the reduction in the breakdown voltage relative to the unbalance amount is increased so as to diminish the process margin. However, in the case of employing the structure according to the first embodiment of the present invention, the process margin is rendered broader than that in the construction of the prior art. As a result, it is possible to increase the impurity concentration in the n-type drift layer 3 so as to make it possible to lower the on-resistance.

Figure 3:
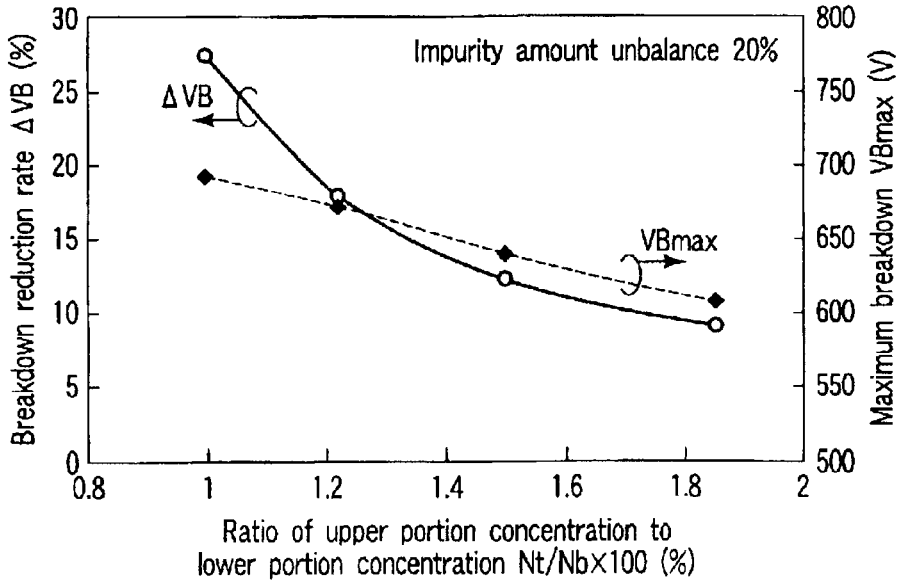
FIG. 3 is a graph showing the maximum breakdown voltage and the reduction rate of the breakdown voltage relative to the change in the gradient of the distribution profile of the impurity concentration in the p-type resurf layer included in the MOSFET shown in FIG. 1A.

FIG. 3 is a graph showing the maximum breakdown voltage and the reduction rate of the breakdown voltage relative to the change in the distribution profile of the impurity concentration in the p-type resurf layer 4 included in the MOSFET according to the first embodiment of the present invention, which is shown in FIG. 1A. In the graph of FIG. 3, a ratio of the impurity concentration Nt in an upper portion of the p-type resurf layer 4 to the impurity concentration Nb in the lower portion of the p-type resurf layer 4 is plotted on the abscissa. On the other hand, the maximum breakdown voltage $VB_{max}$ and a ratio of the reduction amount of the breakdown voltage to the maximum breakdown voltage, i.e., a breakdown voltage reduction rate ΔVB, are plotted on the ordinates.

FIG. 3 covers the case where the impurity unbalance amount between the n-type drift layer 3 and the p-type resurf layer 4 is set at 20% in view of the characteristics shown in FIG. 2. The characteristics covering the case where the gradient of the impurity distribution profile is 1 denote the characteristics of the conventional MOSFT shown in FIG. 13A.

The characteristics shown in FIG. 3 support that, if the gradient of the impurity distribution profile is increased, the breakdown voltage reduction rate ΔVB is decreased by the effect of the impurity distribution profile and that the maximum breakdown voltage is also lowered gradually. It can also be understood that, if it is intended to obtain about 90% of the $VB_{max}$ of the conventional MOSFET as the maximum breakdown voltage of the MOSFET according to the first embodiment of the present invention, it is desirable to set the gradient of the distribution profile of the impurity concentration in the p-type resurf layer 4 at 1.7 or less. Also, where it is desired to suppress the breakdown voltage reduction rate ΔVB to a level lower than half the ΔVB of the conventional MOSFET, it can be understood that the gradient of the distribution profile of the impurity concentration in the p-type resurf layer 4 should be set at 1.4 or more.

<Modification of First Embodiment>

FIG. 4A is a cross sectional view schematically showing the construction of a modification of the MOSFET shown in FIG. 1A, and FIG. 4B shows the impurity concentration profile in the vertical direction in the n-type drift layer and the p-type resurf layer included in the MOSFET shown in FIG. 4A. The MOSFET shown in FIG. 4A differs from the MOSFET according to the first embodiment of the present invention in that the impurity concentration in the p-type resurf layer 4 is rendered constant in the vertical direction and that the impurity concentration in the n-type drift layer 3 is distributed to form an inclined distribution profile in the vertical direction as shown in FIG. 4B. The MOSFET shown in FIG. 4A is equal to the MOSFET according to the first embodiment of the present invention in the other respects and, thus, the same portions are denoted by the same reference numerals so as to omit the overlapping description.

Even if the distribution of the impurity concentration is changed as described above, it is possible to obtain the operation and the effect basically equal to those of the MOSFET according to the first embodiment of the present invention.

<Second Embodiment>

Figure 5A:
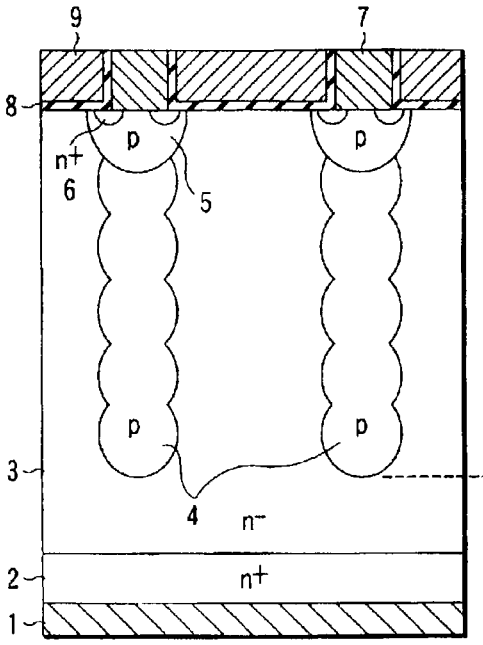
FIG. 5A is a cross sectional view schematically showing the construction of a vertical power MOSFET according to a second embodiment of the present invention.
Figure 5B:
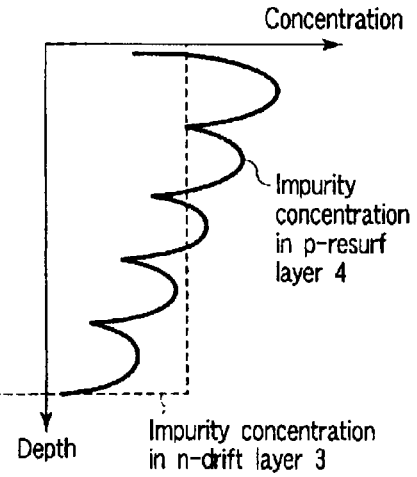
FIG. 5B shows the impurity concentration profile in the vertical direction in the n-type drift layer and the p-type resurf layer included in the MOSFET shown in FIG. 5A.

FIG. 5A is a cross sectional view schematically showing the construction of a vertical power MOSFET according to a second embodiment of the present invention, and FIG. 5B shows the impurity concentration profile in the vertical direction in the n-type drift layer 3 and the p-type resurf layer 4 included in the MOSFET shown in FIG. 5A. In the MOSFET according to the second embodiment of the present invention, the super junction structure included in the MOSFET according to the first embodiment of the present invention is formed by a method of repeating a buried epitaxial growth and an ion implantation.

To be more specific, if an epitaxial growth of an n-type layer and an ion implantation of a p-type dopant are repeated, the impurity concentration in the p-type resurf layer 4 is distributed to form a wavy impurity concentration profile in the depth direction, as shown in FIGS. 5A and 5B. In this case, the impurity concentration profile in which the concentration of the p-type impurity is gradually lowered as a whole in the depth direction, i.e., the impurity concentration in the p-type resurf layer 4 is gradually lowered, can be formed by controlling the ion implanting amount of the p-type dopant for every burying step. As a result, it is possible to expect the operation and the effect basically equal to those produced by the MOSFET according to the first embodiment of present invention.

<Modification of Second Embodiment>

Figure 6A:
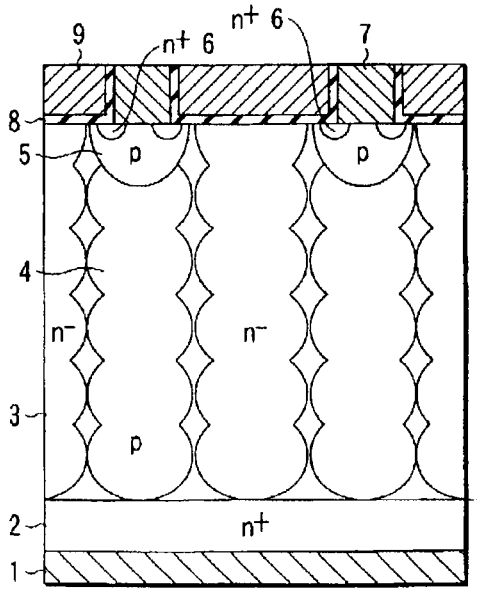
FIG. 6A is a cross sectional view schematically showing the construction of a modification of the MOSFET shown in FIG. 5A.
Figure 6B:
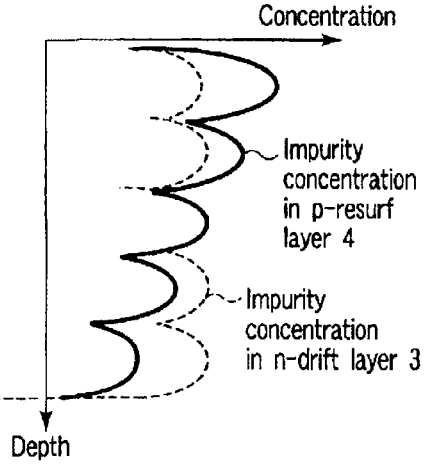
FIG. 6B shows the impurity concentration profile in the vertical direction in the n-type drift layer and the p-type resurf layer included in the MOSFET shown in FIG. 6A.

FIG. 6A is a cross sectional view schematically showing the construction of a modification of the MOSFET according to the second embodiment of the present invention shown in FIG. 5A, and FIG. 6B shows the impurity concentration profile in the vertical direction in the n-type drift layer 3 and the p-type resurf layer 4 included in the MOSFET shown in FIG. 6A. The MOSFET shown in FIG. 6A differs from the MOSFET according to the second embodiment of the present invention, which is shown in FIG. 5A, in that the super junction structure is formed by repeating the process of forming a high resistance layer by a crystal growth and performing an ion implantation of both a p-type dopant and an n-type dopant. The MOSFET shown in FIG. 6A is equal to the MOSFET according to the second embodiment of the present invention in the other respects and, thus, the same portions are denoted by the same reference numerals so as to omit the overlapping description.

As described above, it is possible to obtain the operation and the effect basically equal to those produced by the MOSFET according to the second embodiment of the present invention, even if the method of forming the super junction structure is changed.

Incidentally, the method of forming the super junction structure is not limited to the process described above. It is possible to obtain the similar effect by allowing the impurity concentration in the p-type resurf layer 4 to be distributed to have an inclined distribution profile by employing another process. For example, in the case of employing the process in which a trench is formed first, followed by forming a p-type resurf layer 4 by the p-type layer-buried epitaxial growth within the trench, it is possible to change the manner of the dopant introduction in the depth direction by controlling, for example, the flow rate of the dopant gas so as to permit the impurity concentration to exhibit an inclined distribution profile.

Also, in the case of employing the process in which a trench is formed first, followed by applying an ion implantation obliquely into the side wall of the trench, it is possible to allow the impurity concentration to exhibit an inclined distribution profile in the depth direction by imparting a curvature to the shape of the trench or by applying an ion implantation a plurality of times by changing the angle of the ion implantation.

<Third Embodiment>

Figure 7A:
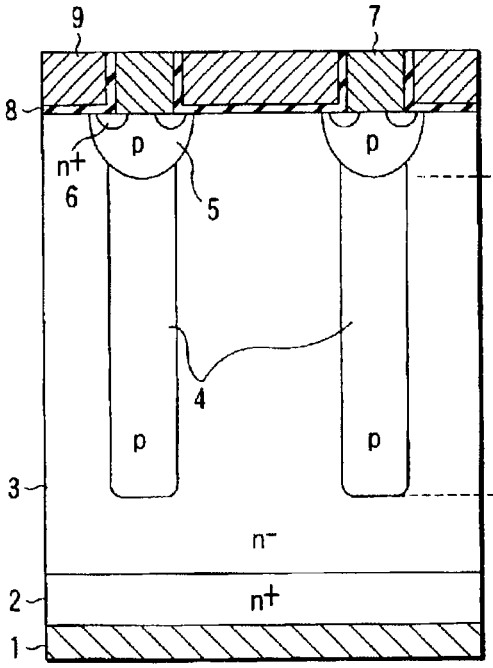
FIG. 7A is a cross sectional view schematically showing the construction of a vertical power MOSFET according to a third embodiment of the present invention.
Figure 7B:
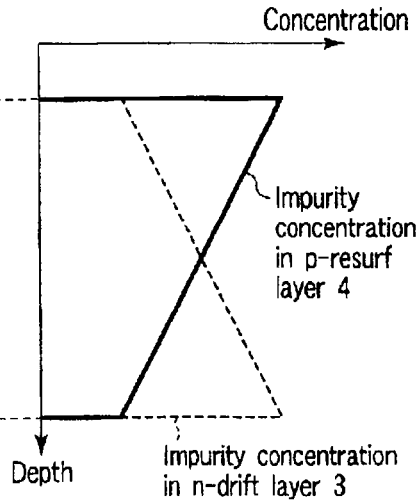
FIG. 7B shows the impurity concentration profile in the vertical direction in the n-type drift layer and the p-type resurf layer included in the MOSFET shown in FIG. 7A.

FIG. 7A is a cross sectional view schematically showing the construction of a vertical power MOSFET according to a third embodiment of the present invention, and FIG. 7B shows the impurity concentration profile in the vertical direction in the n-type drift layer 3 and the p-type resurf layer 4 included in the MOSFET shown in FIG. 7A. The MOSFET according to the third embodiment of the present invention differs from the MOSFET according to the first embodiment of the present invention in that the impurity concentration in the p-type resurf layer 4 included in the MOSFET according to the first embodiment of the present invention is allowed to exhibit an inclined impurity distribution profile in the vertical direction, and that the impurity concentration in the n-type drift layer 3 is also allowed to exhibit an inclined impurity distribution profile in the depth direction. The MOSFET shown in FIG. 7A is equal to the MOSFET according to the first embodiment of the present invention in the other respects and, thus, the same portions are denoted by the same reference numerals so as to omit the overlapping description.

As described above, it is possible to obtain the operation basically equal to that produced by the MOSFET according to the first embodiment of the present invention and an improved effect even if the distribution of the impurity concentration is changed.

Figure 8:
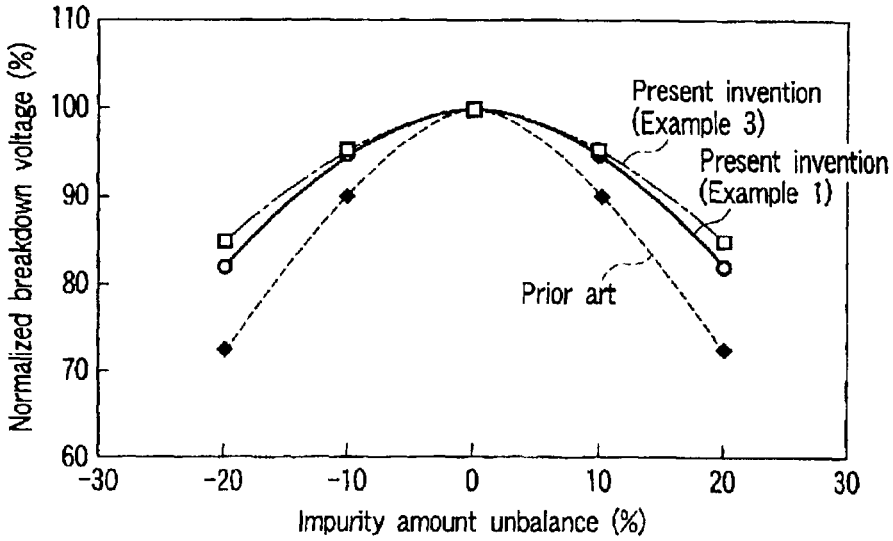
FIG. 8 is a graph showing the relationship between the change in the normalized breakdown voltage and the unbalance amount, i.e., the difference in the amount of the impurity between the n-type drift layer and the p-type resurf layer in the MOSFET shown in FIG. 7A.

FIG. 8 is a graph showing the change in the normalized breakdown voltage relative to the unbalance amount, i.e., the difference in the amount of the impurity between the n-type drift layer 3 and the p-type resurf layer 4 included in the MOSFET according to the third embodiment of the present invention, which is shown in FIG. 7A, the similar change in the normalized breakdown voltage in respect of the MOSFET according to the first embodiment of the present invention, and the similar change in the normalized breakdown voltage in respect of the conventional MOSFET having a super junction structure, which is shown in FIG. 13A.

As apparent from FIG. 8, the MOSFET according to the third embodiment of the present invention permits further lowering the breakdown voltage, compared with not only the conventional MOSFET but also the MOSFET according to the first embodiment of the present invention in which the impurity concentration in only the p-type resurf layer 4 is allowed to exhibit an inclined impurity distribution profile. In addition, it can be understood that the MOSFET according to the third embodiment of the present invention permits increasing the process margin so as to facilitate the lowering of the on-resistance.

Figure 9:
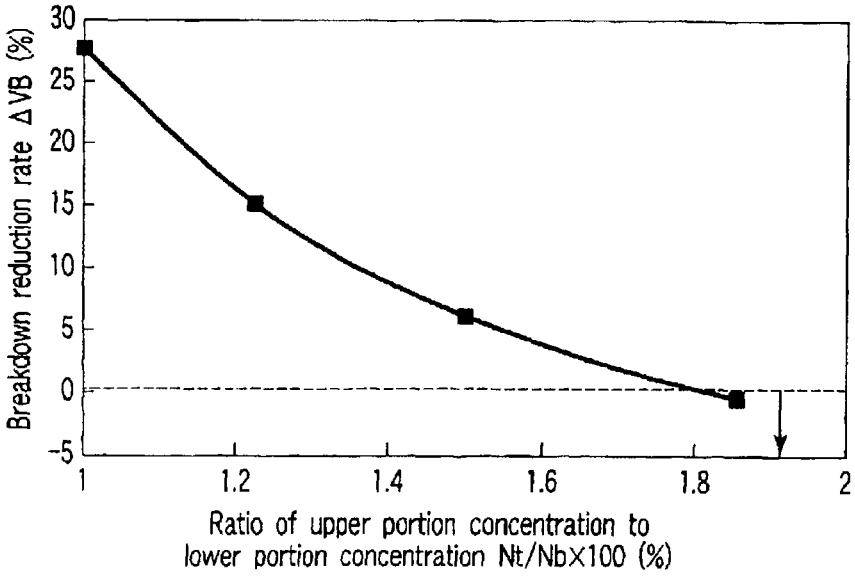
FIG. 9 is a graph showing the maximum breakdown voltage and the reduction rate of the breakdown voltage relative to the change in the gradient of the distribution profile of the impurity concentration in the p-type resurf layer included in the MOSFET shown in FIG. 7A.

FIG. 9 is a graph showing the maximum breakdown voltage and the breakdown voltage reduction rate relative to the change in the gradient of the distribution profile of the impurity in the p-type resurf layer 4 included in the MOSFET according to the third embodiment of the present invention, which is shown in FIG. 7A. In the graph of FIG. 9, plotted on the abscissa is a ratio of the impurity concentration Nt in an upper portion of the p-type resurf layer 4 to the impurity concentration Nb in the lower portion of the p-type resurface layer 4. The ratio noted above represents the gradient of the impurity distribution profile. On the other hand, a ratio of the lowered amount of the breakdown voltage relative to the maximum breakdown voltage to the maximum breakdown voltage, i.e., the breakdown voltage lowering rate ΔVB, is plotted on the ordinate of the graph.

FIG. 9 covers the case where the impurity unbalance amount between the n-type drift layer 3 and the p-type resurf layer 4 is set at 20% in view of the characteristics shown in FIG. 8. The characteristics covering the case where the gradient of the impurity distribution profile is 1 denote the characteristics of the conventional MOSFT shown in FIG. 13A.

The characteristics shown in FIG. 9 support that, if the gradient of the impurity distribution profile is increased, the breakdown voltage reduction rate ΔVB is decreased by the effect of the impurity distribution profile. Also, if the gradient of the impurity concentration profile in the p-type resurf layer 4 included in the MOSFET according to the third embodiment of the present invention exceeds 1.82, the case where the impurity concentration in the n-type drift layer 3 is equal to the impurity concentration in the p-type resurf layer 5 fails to provide the state of obtaining the maximum breakdown voltage $VB_{max}$. As a result, the breakdown voltage reduction rate ΔVB is rendered minus so as to make the design complex. Such being the situation, it is desirable for the gradient of the impurity concentration profile in the p-type resurf layer 4 to be not larger than 1.82.

Further, since the impurity concentration in the upper portion of the n-type drift layer 3 is low, compared with the MOSFET according to the first embodiment of the present invention, i.e., the case where the p-type resurf layer 4 alone is allowed to exhibit an inclined impurity distribution profile, the upper portion of the n-type drift layer 3 is promptly depleted upon application of a high voltage. As a result, the capacitance between the gate and the source of the MOSFET is diminished so as to make it possible to expect a rapid switching operation.

It can also be understood from the characteristics shown in FIG. 9 that, where it is desired to suppress the breakdown voltage reduction rate ΔVB of the MOSFET according to the third embodiment of the present invention to a half or less of the breakdown voltage reduction rate ΔVB of the conventional MOSFET, the gradient of the impurity concentration profile in the p-type resurf layer 4 should be set at 1.25 or more.

Incidentally, in the third embodiment of the present invention described above, the impurity concentration profile in the n-type drift layer 3 is inclined in the direction opposite to the direction in which the impurity concentration profile in the p-type resurf layer 4 is inclined, and these two impurity concentration profiles are equal to each other in the amount of the inclination. However, the amount of inclination of the impurity concentration profile in the n-type drift layer 3 need not be equal to that in the p-type resurf layer 4 in the third embodiment of the present invention.

The method of forming the super junction structure is not limited to the process described above. It is also possible to obtain the similar effect by allowing the impurity concentration in the p-type resurf layer 4 to exhibit an inclined distribution profile by using another process.

<Fourth Embodiment>

Figure 10A:
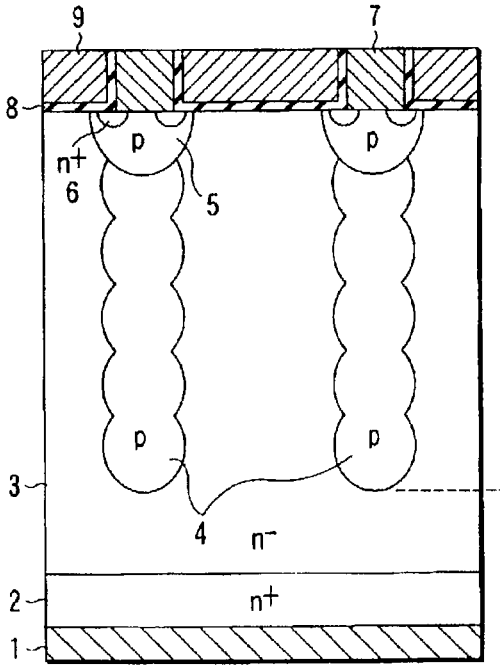
FIG. 10A is a cross sectional view schematically showing the construction of a vertical power MOSFET according to a fourth embodiment of the present invention.
Figure 10B:
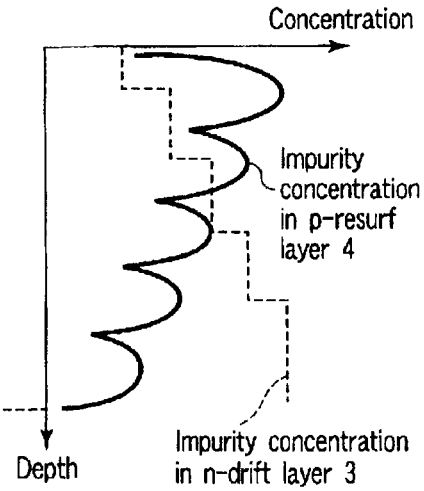
FIG. 10B shows the impurity concentration profile in the vertical direction in the n-type drift layer and the p-type resurf layer included in the MOSFET shown in FIG. 10A.

FIG. 10A is a cross sectional view schematically showing the construction of a vertical power MOSFET according to a fourth embodiment of the present invention, and FIG. 10B shows the impurity concentration profile in the vertical direction in the n-type drift layer and the p-type resurf layer included in the MOSFET shown in FIG. 10A. In the MOSFET according to the fourth embodiment of the present invention, the super junction structure included in the MOSFET according to the third embodiment of the present invention is formed by the method of repeating a buried epitaxial growth and an ion implantation.

To be more specific, if the epitaxial growth of an n-type layer and the ion implantation of a p-type dopant are repeated, formed is a wavy profile in the depth direction in respect of the distribution of the impurity concentration in the p-type resurf layer 4, as shown in FIG. 10B.

In this case, it is possible to form as a whole both a profile in which the amount of the n-type impurity is gradually increased, i.e., the impurity concentration in the n-type drift layer 3 is gradually increased, and another profile in which the amount of the p-type impurity is gradually decreased, i.e., the impurity concentration in the p-type resurf layer is gradually lowered, by controlling the impurity concentration in each of the n-type layers and the amount of the ion implantation of the p-type dopant in every burying step. As a result, it is possible to expect the operation and the effect basically equal to those produced by the MOSFET according to the third embodiment of the present invention.

<Modification of Fourth Embodiment>

Figure 11A:
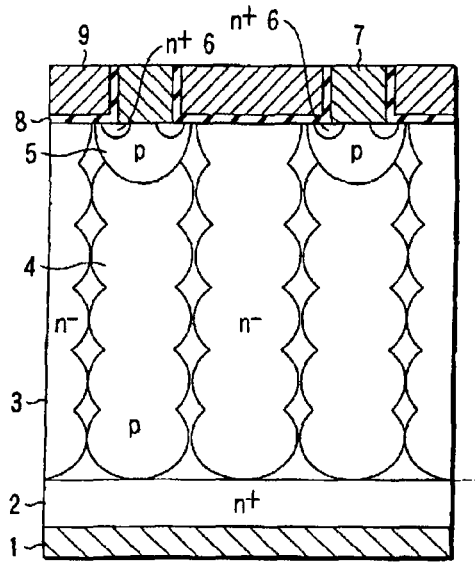
FIG. 11A is a cross sectional view schematically showing the construction of a modification of the MOSFET shown in FIG. 10A.
Figure 11B:
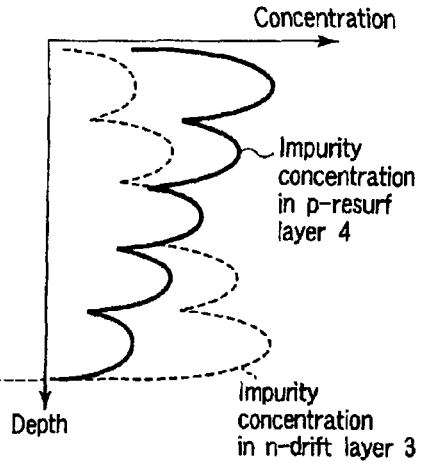
FIG. 11B shows the impurity concentration profile in the vertical direction in the n-type drift layer and the p-type resurf layer included in the MOSFET shown in FIG. 11A.

FIG. 11A is a cross sectional view schematically showing the construction of a vertical power MOSFET according to a modification of the fourth embodiment of the present invention, and FIG. 11B shows the impurity concentration profile in the vertical direction in the n-type drift layer and the p-type resurf layer included in the MOSFET shown in FIG. 11A. The MOSFET shown in FIG. 11A differs from the MOSFET according to the fourth embodiment of the present invention in that the super junction structure is formed by repeating the processes of forming a high resistance layer by means of crystal growth and of introducing both a p-type dopant and an n-type dopant by means of an ion implantation (the amount of ions to be implanted being controlled every time ions are implanted into each layer). The MOSFET shown in FIG. 11A is equal to the MOSFET shown in FIG. 10A in the other respects and, thus, the same portions are denoted by the same reference numerals so as to omit the overlapping description.

It is possible to obtain the operation and effect basically equal to those produced by the MOSFET according to the second embodiment of the present invention even if the method of forming a super junction structure is changed in this fashion.

Incidentally, the method of forming a super junction structure is not limited to the process described above. It is also possible to obtain the similar effect by allowing the p-type resurf layer 4 to exhibit an inclined impurity concentration distribution profile by using another process.

For example, in the case of employing the process in which a trench is formed first, followed by forming a p-type resurf layer 4 within the trench by performing a p-type layer-buried epitaxial growth, it is possible to allow the p-type resurf layer 4 to exhibit an inclined impurity distribution profile by changing the manner of the dopant introduction in the depth direction by controlling the width and shape of the trench and the flow rate of the dopant gas.

Also, in the case of employing the process in which a trench is formed first, followed by applying an ion implantation obliquely into the side wall of the trench, it is possible to allow the p-type resurf layer 4 to exhibit an inclined impurity distribution profile in the depth direction by imparting a curvature to the shape of the trench or by performing an ion implantation treatment a plurality of times by changing the ion implanting angle.

<Fifth Embodiment>

Figure 12:
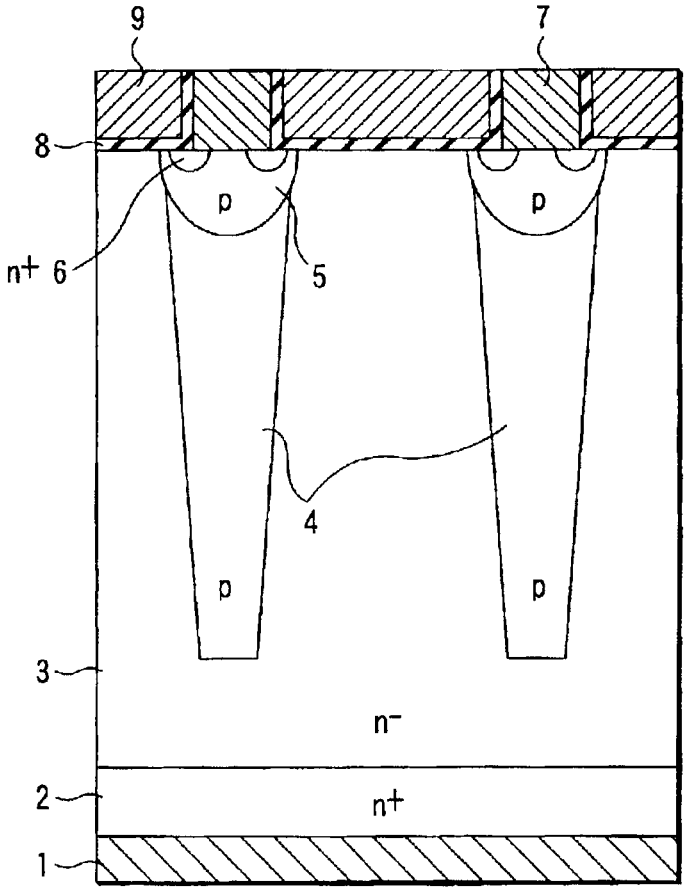
FIG. 12 is a cross sectional view schematically showing the construction of a vertical power MOSFET according to a fifth embodiment of the present invention.

FIG. 12 is a cross sectional view schematically showing the construction of a vertical power MOSFET according to a fifth embodiment of the present invention. In the MOSFET shown in FIG. 12, the width of resurf layer 4 included in the MOSFET according to the first embodiment of the present invention is changed in the depth direction and the impurity concentration is rendered constant in the vertical direction, thereby allowing the p-type resurf layer 4 to be different from the n-type drift layer 3 in the amount of the impurity in the vertical direction. The MOSFET shown in FIG. 12 is equal to the MOSFET shown in FIG. 1A in the other respects and, thus, the same portions are denoted by the same reference numerals so as to omit the overlapping description.

The amount of the impurity within the p-type resurf layer 4 is equal to the product of the concentration by the width. Therefore, where the impurity concentration within the p-type resurf layer 4 is constant, the amount of the impurity is decreased with decrease in the width in the depth direction. On the other hand, the width of the n-type drift layer 3 is increased in the depth direction and, thus, the amount of the impurity in the n-drift layer 3 is increased in the depth direction. It follows that it is possible to expect the operation and effect similar to those produced by the MOSFET according to the third embodiment of the present invention, i.e., the case where the p-type resurf layer 4 and the n-type drift layer 3 are allowed to exhibit inclined impurity distribution profiles opposite to each other in the direction.

In this case, the ratio in width of the upper portion to the lower portion of the p-type resurf layer 4 is equal in significance to the gradient of the inclined impurity distribution profile in the p-type resurf layer 4 included in the MOSFET according to the third embodiment of the present invention. Therefore, it is desirable for the ratio noted above to fall within a range of between 1.82 and 1.25.

Incidentally, the construction of the MOSFET according to the fifth embodiment of the present invention can be formed by the process in which a trench is formed first, followed by applying a buried epitaxial growth. In this case, a trench is formed by a dry etching method such that the width of the trench is gradually decreased in the depth direction, followed by forming a p-type resurf layer 4 by carrying out a crystal growth such that the impurity concentration is rendered uniform.

Incidentally, the present invention is not limited to the embodiments described above and can be applied to every modification that can be reached easily by those skilled art based on the disclosure herein.

For example, the shape of each of the super junction structure, the p-type base layer 5, the $n^+$-type source layer 6 and the gate electrode 9 is not limited to the stripe shape employed in the embodiments described above, and it is possible for these super junction structure etc. to be arranged zigzag or in the shape of a lattice.

Also, the semiconductor material employed in the present invention is not limited to silicon. Alternatively, it is also possible to use a compound semiconductor material such as silicon carbide (SiC), gallium nitride (GaN) or aluminum nitride (AlN) as well as diamond.

Also, each of the embodiments described above is directed to a vertical element. However, it is also possible to apply the technical idea of the present invention to a lateral element as far as the element has a super junction structure. Also, the present invention is not limited to a power MOSFET having a super junction structure. It is also possible to apply the technical idea of the present invention to a switching element having a super junction structure such as SBD, MPS diode, SIT, JFET or IGBT and to a composite or integrated element comprising a diode and a switching element.

As described above, the power semiconductor device according to the present invention permits increasing the process margin in respect of the amount of the impurity relative to the breakdown voltage without increasing the on-resistance so as to suppress the reduction of the breakdown voltage relative to the change in the amount of the impurity, thereby realizing a power MOSFET having a high breakdown voltage and a low on-resistance.

What is claimed is:

1. A power semiconductor device comprising:

a first semiconductor layer of a first conductivity type;

a first main electrode electrically connected to the first semiconductor layer;

second semiconductor layers of a second conductivity type formed within the first semiconductor layer and periodically arranged in a lateral direction, a profile of an amount of an impurity in a vertical direction of the second semiconductor layers being [differ] *different* from a profile of an amount of the impurity in the vertical direction of the first semiconductor layer;

a third semiconductor layer of the second conductivity type selectively formed in surfaces of the first semiconductor layer and the second semiconductor layer;

a fourth semiconductor layer of the first conductivity type selectively formed in a surface of the third semiconductor layer;

a second main electrode formed to be connected to the surface of the third semiconductor layer and a surface of the fourth semiconductor layer; and a control electrode formed on the first semiconductor layer, the third semiconductor layer and the fourth semiconductor layer with a gate insulating film interposed therebetween, wherein the first semiconductor layer has a constant concentration of the impurity in a vertical direction from the second main electrode to the first main electrode; [and]

[the] *each* second semiconductor layer has a concentration of the impurity distributed such that the impurity concentration is decreased in the vertical direction from the second main electrode to the first main electrode*; and*

*a ratio Nt/Nb of an amount Nt of the impurity on a side of an end of each second semiconductor layer that is close to the second main electrode to an amount Nb of the impurity on a side of another end of each second semiconductor layer that is close to the first main electrode is not larger than 1.7.*

[2. A power semiconductor device according to claim 1, wherein a ratio Nt/Nb of an amount Nt of the impurity on a side of an end of the second semiconductor layer close to the second main electrode to an amount Nb of the impurity on a side of another end close to the first main electrode is not larger than 1.7.]

3. A power semiconductor device according to claim [2] *1*, wherein [a] *the* ratio Nt/Nb [of an amount Nt of the impurity on a side of an end of the second semiconductor layer close to the second main electrode to an amount Nb of the impurity on a side of another end close to the first main electrode is not larger] *is not smaller* than 1.4.

*4. A power semiconductor device according to claim 1, wherein a portion of the first semiconductor layer is provided between the first main electrode and the second semiconductor layers along the vertical direction.*

*5. A power semiconductor device according to claim 1, wherein an impurity concentration of the first semiconductor layer is uniform in a vertical direction from the second main electrode to the first main electrode.*

*6. A power semiconductor device according to claim 1, wherein the second semiconductor layers are provided in trenches, and the trenches are provided in the first semiconductor layer.*

*7. A power semiconductor device according to claim 6, wherein the impurity concentration of the first semiconductor layer is uniform.*

*8. A power semiconductor device according to claim 7, wherein the impurity concentration of the first semiconductor layer is uniform in a vertical direction from a bottom of the third semiconductor layer to a bottom of the trench.*

*9. A power semiconductor device according to claim 1, wherein the first semiconductor layer further comprises:*

*a fifth semiconductor layer of the first conductivity type between the second semiconductor layers;*

*and a sixth semiconductor layer of the first conductivity type provided on the first electrode, wherein*

*an impurity concentration of the fifth semiconductor layer is lower than that of the sixth semiconductor layer.*

*10. A power semiconductor device according to claim 1, wherein the second semiconductor layers further comprise a plurality of impurity regions, each impurity region being formed by an application of an impurity at different vertical depths and having an impurity concentration, the impurity concentrations of the impurity regions substantially decreasing in a direction from the second main electrode to the first main electrode.*

*11. A power semiconductor device according to claim 10, wherein an impurity concentration of the first semiconductor layer is uniform.*

*12. A power semiconductor device according to claim 11, wherein the impurity concentration of the first semiconductor layer is uniform in a vertical direction from an impurity peak position of a top impurity region in the plurality of impurity regions to an impurity peak position of a bottom impurity region in the plurality of impurity regions.*

*13. A power semiconductor device according to claim 10, wherein a portion of the first semiconductor layer is provided between the first main electrode and the second semiconductor layers.*

*14. A power semiconductor device according to claim 10, wherein the first semiconductor layer further comprises:*

*a fifth semiconductor layer of the first conductivity type between the second semiconductor layers;*

*and a sixth semiconductor layer of the first conductivity type provided on the first electrode, wherein*

*an impurity concentration of the fifth semiconductor layer is lower than that of the sixth semiconductor layer.*

*15. A power semiconductor device according to claim 10, wherein the impurity concentration of a portion of a first impurity region in the plurality of impurity regions that is closer to the second main electrode is less than the impurity concentration of a portion of a second impurity region in the plurality of impurity regions that is located closer to the first main electrode than is the first impurity region in the plurality of impurity regions.*

*16. A power semiconductor device of claim 1, wherein*

*the first main electrode extends in a first direction; and*

*the second semiconductor layers are periodically spaced apart in the first direction.*

*17. A power semiconductor device of claim 16, wherein the second semiconductor layers comprise a plurality of columns extending inwardly of the first semiconductor layer in a second direction generally perpendicular to the first direction.*

*18. A power semiconductor device according to claim 10, wherein a ratio Nt/Nb of a maximum amount Nt of the impurity of the second semiconductor layers in the impurity region closest to the second main electrode to a maximum amount Nb of the impurity of the second semiconductor layers in the impurity region closest to the first main electrode is not larger than 1.7.*

*19. A power semiconductor device according to claim 18, wherein the ratio Nt/Nb is not smaller than 1.4.*

*20. A power semiconductor device comprising:*

*a first semiconductor layer of a first conductivity type;*

*a first main electrode electrically connected to the first semiconductor layer;*

*second semiconductor layers of a second conductivity type, each second semiconductor layer formed in a*

*substantially vertical column within the first semiconductor layer and periodically arranged in a horizontal direction;*

*a third semiconductor layer of the second conductivity type selectively formed in surfaces of the first semiconductor layer and the second semiconductor layer;*

*a fourth semiconductor layer of the first conductivity type selectively formed in a surface of the third semiconductor layer;*

*a second main electrode electrically connected to a surface of the third semiconductor layer and a surface of the fourth semiconductor layer;*

*an insulating film formed on a portion of the first semiconductor layer, a portion of the third semiconductor layer, and a portion of the fourth semiconductor layer; and*

*a gate electrode formed on the insulating film;*

*wherein an impurity concentration of the first semiconductor layer is constant in a vertical direction from the second main electrode to the first main electrode; and*

*wherein an impurity concentration of the second semiconductor layers decreases in a vertical direction from the second main electrode to the first main electrode, and said impurity concentration of the second semiconductor layers being different from an impurity concentration of the first semiconductor layer.*

*21. A power semiconductor device according to claim 20, wherein a ratio Nt/Nb of an amount Nt of the impurity on a side of an end of the second semiconductor layers close to the second main electrode to an amount Nb of the impurity on a side of another end of the second semiconductor layers close to the first main electrode is not larger than 1.7.*

*22. A power semiconductor device according to claim 21, wherein the ratio Nt/Nb is not smaller than 1.4.*

*23. A power semiconductor device according to claim 20, wherein the second semiconductor layers further comprise a plurality of impurity regions, each impurity region being formed by an application of an implant dosage of an impurity at different vertical depths and having an impurity concentration, the impurity concentrations of the plurality of impurity regions substantially decreasing in a direction from the second main electrode to the first main electrode.*

*24. A power semiconductor device according to claim 23, wherein a ratio Nt/Nb of a maximum amount Nt of the impurity of the second semiconductor layers in the impurity region closest to the second main electrode to a maximum amount Nb of the impurity of the second semiconductor layers in the impurity region closest to the first main electrode is not larger than 1.7.*

*25. A power semiconductor device according to claim 24, wherein the ratio Nt/Nb is not smaller than 1.4.*

*26. A power semiconductor device according to claim 23, wherein a ratio Nt/Nb of an average amount Nt of the impurity of the second semiconductor layers in the impurity region closest to the second main electrode to an average amount Nb of the impurity of the second semiconductor layers in the impurity region closest to the first main electrode is not larger than 1.7.*

*27. A power semiconductor device according to claim 26, wherein the ratio Nt/Nb is not smaller than 1.4.*

*28. A power semiconductor device according to claim 20, wherein*

*an impurity concentration of a first conductivity type impurity in the first semiconductor layer is constant in a direction orthogonal to a surface of the first semiconductor layer; and*

*an impurity concentration of a first conductivity type impurity in the second semiconductor layers is constant in a direction from the second main electrode to the first main electrode, and an impurity concentration of a second conductivity type impurity decreases in a direction from the second main electrode to the first main electrode.*

*29. A power semiconductor device comprising:*

*a first semiconductor layer of a first conductivity type;*

*a first main electrode electrically connected to the first semiconductor layer;*

*second semiconductor layers of a second conductivity type, each second semiconductor layer formed in a substantially vertical column within the first semiconductor layer and periodically arranged in a horizontal direction;*

*a third semiconductor layer of the second conductivity type selectively formed in surfaces of the first semiconductor layer and the second semiconductor layer;*

*a fourth semiconductor layer of the first conductivity type selectively formed in a surface of the third semiconductor layer;*

*a second main electrode electrically connected to a surface of the third semiconductor layer and a surface of the fourth semiconductor layer;*

*an insulating film formed on a portion of the first semiconductor layer, a portion of the third semiconductor layer, and a portion of the fourth semiconductor layer; and*

*a gate electrode formed on the insulating film; wherein*

*an impurity concentration of a first conductivity type impurity in the first semiconductor layer is constant in a direction orthogonal to a surface of the first semiconductor layer; and*

*an impurity concentration of a first conductivity type impurity in the second semiconductor layers is constant in a direction from the second main electrode to the first main electrode, and an impurity concentration of a second conductivity type impurity decreases in a direction from the second main electrode to the first main electrode.*

*30. A power semiconductor device according to claim 29, wherein a ratio Nt/Nb of an amount Nt of the second conductivity type impurity on a side of an end of the second semiconductor layers close to the second main electrode to an amount Nb of the second conductivity type impurity on a side of another end of the second semiconductor layers close to the first main electrode is not larger than 1.7.*

*31. A power semiconductor device according to claim 30, wherein the ratio Nt/Nb is not smaller than 1.4.*

*32. A power semiconductor device according to claim 29, wherein the second semiconductor layers further comprise a plurality of implantation regions, each implantation region being formed by the application of an ion implantation dosage at different vertical depths and having an impurity concentration substantially proportional to the ion implantation dosage, the ion implantation dosages decreasing in a direction from the second main electrode to the first main electrode.*

*33. A power semiconductor device according to claim 32, wherein a ratio Nt/Nb of a maximum amount Nt of the second conductivity type impurity of the second semiconductor layer in the implantation region closest to the second main electrode to a maximum amount Nb of the second conductivity type impurity of the second semiconductor layer in the implantation region closest to the first main electrode is not smaller than 1.4.*

*34. A power semiconductor device according to claim 29, wherein a ratio Nt/Nb of an average amount Nt of the second conductivity type impurity of the second semiconductor layers in the implantation region closest to the second main electrode to an average amount Nb of the second conductivity type impurity of the second semiconductor layer in the implantation region closest to the first main electrode is not larger than 1.7.*

*35. A power semiconductor device according to claim 34, wherein the ratio Nt/Nb is not smaller than 1.4.*

* * * * *